(12) United States Patent
Yamaguchi

(10) Patent No.: US 6,759,926 B2
(45) Date of Patent: Jul. 6, 2004

(54) LC FILTER CIRCUIT, MONOLITHIC LC COMPOSITE COMPONENT, MULTIPLEXER, AND RADIO COMMUNICATION DEVICE

(75) Inventor: Naoto Yamaguchi, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 31 days.

(21) Appl. No.: 10/212,261

(22) Filed: Aug. 6, 2002

(65) Prior Publication Data

US 2003/0038689 A1 Feb. 27, 2003

(30) Foreign Application Priority Data

Aug. 9, 2001 (JP) ......................................... 2001-242606
Apr. 30, 2002 (JP) ......................................... 2002-128848

(51) Int. Cl.[7] .............................. H03H 7/00; H03H 7/01
(52) U.S. Cl. ........................ 333/175; 333/172; 333/177; 333/185
(58) Field of Search ................................. 333/172, 175, 333/177, 185

(56) References Cited

U.S. PATENT DOCUMENTS

| | | | | |
|---|---|---|---|---|
| 5,448,209 A | * | 9/1995 | Hirai et al. .................. 333/204 |
| 5,834,992 A | * | 11/1998 | Kato et al. .................... 333/185 |
| 5,945,892 A | * | 8/1999 | Kato et al. .................... 333/185 |
| 6,433,653 B1 | * | 8/2002 | Matsumura et al. ......... 333/185 |
| 6,504,451 B1 | * | 1/2003 | Yamaguchi .................. 333/177 |
| 6,529,101 B2 | * | 3/2003 | Tojyo et al. ................. 333/175 |
| 6,529,102 B2 | * | 3/2003 | Masuda et al. .............. 333/177 |
| 6,542,053 B2 | * | 4/2003 | Yamaguchi .................. 333/177 |
| 6,583,686 B2 | * | 6/2003 | Matsumura et al. ......... 333/175 |
| 6,587,020 B2 | * | 7/2003 | Tojyo .......................... 333/185 |
| 2002/0057139 A1 | * | 5/2002 | Matsumura et al. ......... 333/185 |

* cited by examiner

Primary Examiner—Michael Tokar
Assistant Examiner—Khai M. Nguyen
(74) Attorney, Agent, or Firm—Keating & Bennett, LLP

(57) ABSTRACT

An LC filter circuit includes first and second LC-trap capacitor conductors, respectively, that are opposed to third and LC-trap capacitor conductors with an insulating sheet therebetween to define first and second LC trap capacitors, respctively. A portion of a first LC resonator inductor and the first LC trap capacitor define an input-side LC trap circuit, and a portion of a second LC resonator inductor and the second LC trap capacitor define an output-side LC trap circuit.

18 Claims, 9 Drawing Sheets

LC FILTER CIRCUIT, MONOLITHIC LC COMPOSITE COMPONENT, MULTIPLEXER, AND RADIO COMMUNICATION DEVICE

BACKGROUND OF THE INVENTION

1. Field of the Invention

The present invention relates to an LC filter circuit, a monolithic LC composite component, and a multiplexer used in, for example, a radio communication device such as a portable telephone, and relates to the radio communication device.

2. Description of the Related Art

A conventional monolithic LC filter is shown in FIG. 10. The monolithic LC filter 40 includes an insulating sheet 42 on the surface of which LC-trap coil conductors 50 and 51 are provided, an insulating sheet 43 on the surface of which resonator capacitor conductors 52 and 53 are provided, insulating sheets 44 and 46 on the surfaces of which LC-trap capacitor conductors 54, 55, 58 and 59 are provided, respectively, an insulating sheet 45 on the surface of which input/output conductors 56 and 57 are provided, an insulating sheet 47 on the surface of which a coupling capacitor conductor 60 is provided, an insulating sheet 48 on the surface of which resonator coil conductors 61 and 62 are provided, and insulating sheets 41 and 49 on the surfaces of which ground conductors 63 and 64 are provided, respectively.

The insulating sheets 41 to 49 are laminated, and after insulating sheets for protection are placed on the top and bottom thereof, they are integrally baked. A laminate 67 shown in FIG. 11 is thus produced. The laminate 67 has an input terminal 68, an output terminal 69, relay terminals 70 and 71, and a ground terminal G provided thereon. One end 50a of the LC-trap coil conductor 50 and one end 56a of the input/output conductor 56 are connected to the input terminal 68. A first end 51a of the LC-trap coil conductor 51 and a first end 57a of the output conductor 57 are connected to the output terminal 69. A second end 50b of the LC-trap coil conductor 50, LC-trap capacitor conductors 54 and 58, and a first end 61a of the resonator coil conductor 61 are connected to the relay terminal 70. A second end 51b of the LC-trap coil conductor 51, LC-trap capacitor conductors 55 and 59, and a first end 62a of the resonator coil conductor 62 are connected to the relay terminal 71. Also, the resonator capacitor conductors 52 and 53, the second ends 61b and 62b of the respective resonator coil conductors 61 and 62, and the ground conductors 63 and 64 are connected to the ground terminal G.

FIG. 12 is an electrical equivalent circuit diagram of the monolithic LC filter 40 having the above-described structure. An LC resonator Q1 includes a resonator inductor L1 defined by the resonator coil conductor 61, and a resonator capacitor C1 defined by opposing the resonator capacitor conductor 52 to the LC-trap capacitor conductor 54. Likewise, an LC resonator Q2 includes a resonator inductor L2 defined by the resonator coil conductor 62, and a resonator capacitor C2 defined by opposing the resonator capacitor 53 to the LC-trap capacitor conductor 55. These LC resonators Q1 and Q2 are capacitively coupled through a coupling capacitor C3 defined by opposing the coupling capacitor conductor 60 to the LC-trap capacitor conductors 58 and 59.

An LC trap circuit T1 is inserted between the input terminal 68 and the LC resonator Q1, and an LC trap circuit T2 is inserted between the output terminal 69 and the LC resonator Q2. The LC trap circuit T1 includes an LC trap inductor L3 defined by the LC-trap coil conductor 50, and an LC trap capacitor C4 defined by opposing the LC-trap capacitor conductors 54 and 58 to the input conductor 56. Likewise, the LC trap circuit T2 includes an LC trap inductor L4 defined by the LC-trap coil conductor 51, and an LC trap capacitor C5 defined by opposing the LC-trap capacitor conductors 55 and 59 to the output conductor 57.

In this monolithic LC filter 40, the LC-trap coil conductors 50 and 51 defining the respective LC trap circuits T1 and T2, and the resonator coil conductors 61 and 62 defining the respective LC resonators Q1 and Q2, are provided on separate insulating sheets 42 and 48, respectively. As a result, the area required to provide a conductor pattern defining a coil increases, thereby making it difficult to reduce the size and height of the LC filter 40.

SUMMARY OF THE INVENTION

In order to overcome the problems described above, preferred embodiments of the present invention provide an LC filter circuit, a monolithic LC composite component, a multiplexer, and a radio communication device having reduced sizes and heights.

A preferred embodiment of the present invention provides an LC filter circuit including an input terminal and an output terminal, first and second LC resonators electrically connected between the input terminal and the output terminal, an input-side LC trap circuit electrically connected between the input terminal and the first LC resonator, and an output-side LC trap circuit electrically connected between the output terminal and the second LC resonator. A portion of an inductor defining the first LC resonator also provides an inductor defining the input-side LC trap circuit, and a portion of an inductor defining the second LC resonator also provides an inductor defining the output-side LC trap circuit.

Another preferred embodiment of the present invention provides a monolithic LC composite component including a laminate including a plurality of laminated insulating layers, an input terminal and an output terminal provided on the surface of the laminate, first and second LC resonators which are provided in the laminate, and each of which is defined by an LC-resonator inductor conductor and an LC-resonator capacitor conductor, an input-side LC trap including an LC-trap capacitor conductor electrically connected between the input terminal and the first LC resonator, and a portion of the LC-resonator inductor conductor defining the first LC resonator, and an output-side LC trap including an LC-trap capacitor conductor electrically connected between the output terminal and the second LC resonator, and a portion of the LC-resonator inductor conductor defining the second LC resonator.

With these arrangements, since a portion of the inductor L of the LC resonator is arranged to also provide an LC trap inductor L, it is unnecessary to separately provide an LC-trap coil conductor. As a result, an LC composite component having a greatly reduced size and height is achieved.

The multiplexer and the radio communication device according to further preferred embodiments of the present invention include a monolithic LC composite component having the above-described features. This achieves a multiplexer and a radio communication device that are compact and low-profile.

The above and other elements, characteristics, features, and advantages of the present invention will become clear from the following detailed description of preferred embodiments of the present invention in conjunction with the accompanying drawings.

DETAILED DESCRIPTION OF PREFERRED EMBODIMENTS

Hereinafter, preferred embodiments of an LC filter, a monolithic LC composite component, a multiplexer, and a radio communication device according to the present invention will be described with reference to the accompanying drawings.

Figure 1:
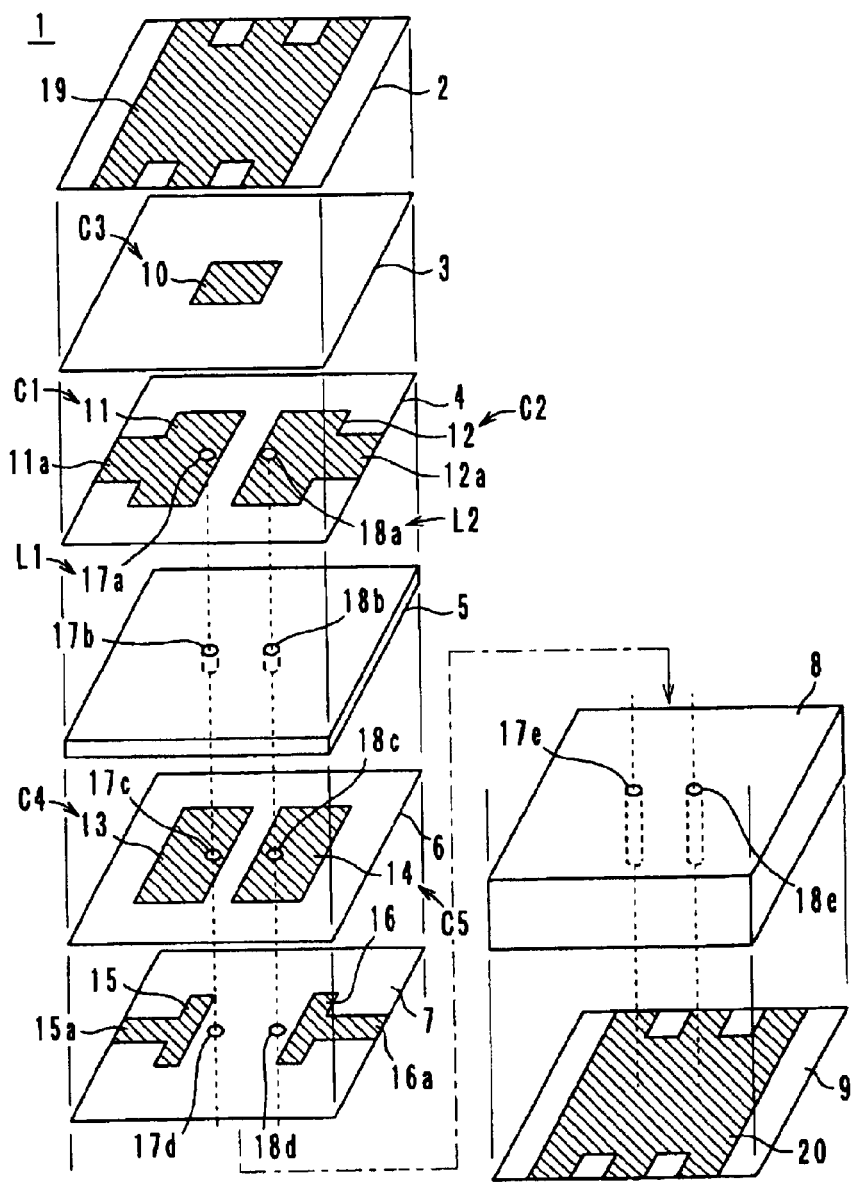
FIG. 1 is an exploded perspective view illustrating a preferred embodiment of a monolithic LC filter according to the present invention.

Referring to FIG. 1, the monolithic LC filter 1, which is a representative example of a monolithic LC composite component, is defined by a laminate 21 formed by laminating an insulating sheet 3 on the surface of which a coupling capacitor conductor 10 is provided, an insulating sheet 4 on the surface of which first and second LC-resonator capacitor conductors 11 and 12 are provided, insulating sheets 6 and 7 on the surfaces of which input-side LC-trap capacitor conductors 13 and 15 and output-side LC-trap capacitor conductors 14 and 16 are provided, insulating sheets 5 and 8 in which inductor via-holes 17b and 18b, and 17e and 18e are provided, and insulating sheets 2 and 9 on the surfaces of which ground conductors 19 and 20 are provided.

The insulating sheets 2 to 9 define insulating layers of the laminate 21, and are preferably formed by kneading dielectric ceramic powder or magnetic ceramic powder together with binder into a sheet, and by baking it. The conductors 10–16, 19, and 20 are preferably made of Ag, Pd, Cu, Ni, Au, Ag—Pd, or other suitable material, and are formed preferably by a method such as printing, sputtering, vapor deposition, or photolithography.

Figure 10:
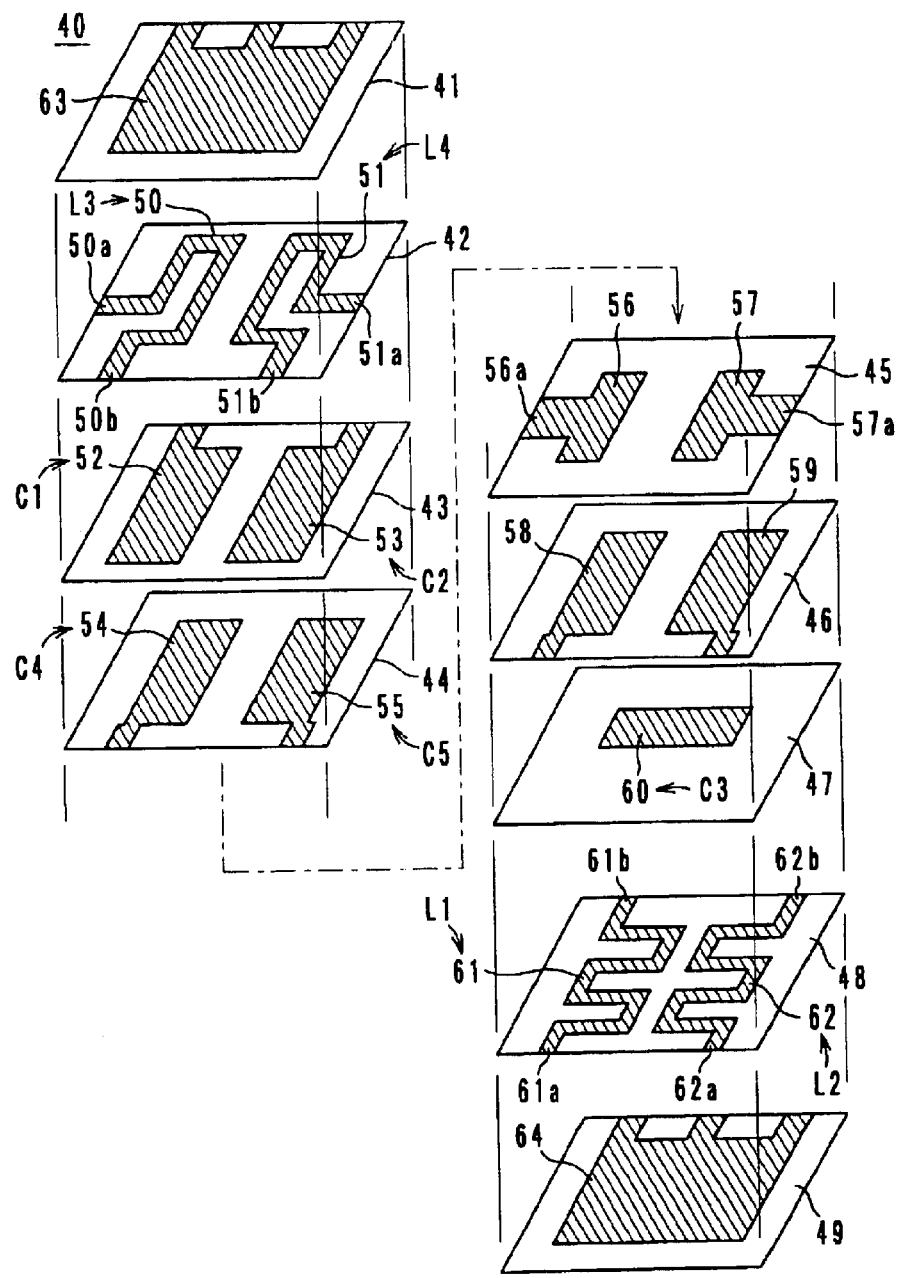
FIG. 10 is an exploded perspective view illustrating a related monolithic LC filter.
Figure 11:
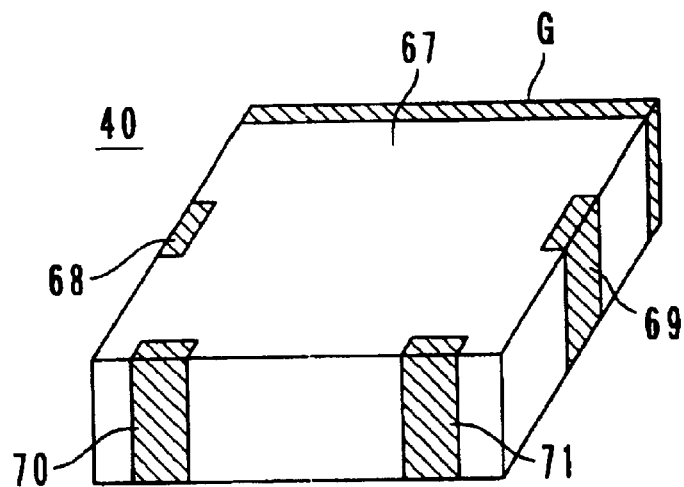
FIG. 11 is a perspective view illustrating the appearance of the monolithic LC filter shown in FIG. 10.
Figure 12:
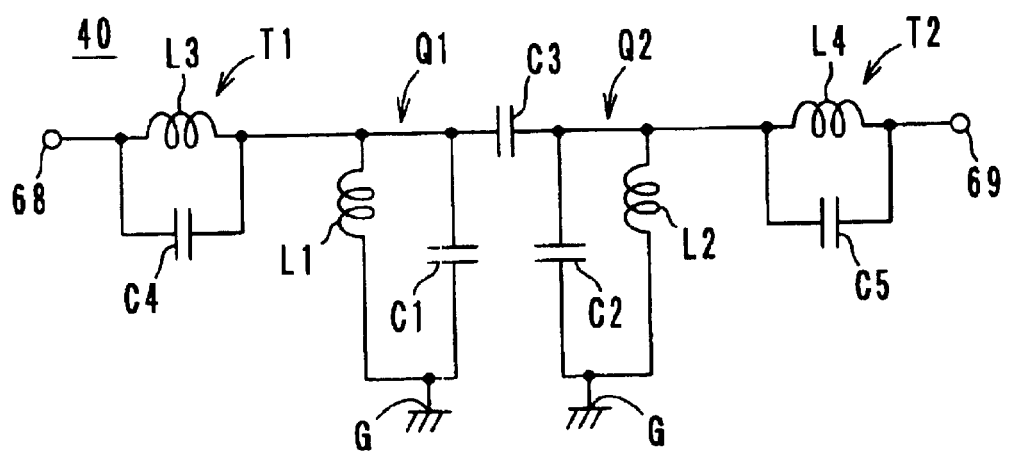
FIG. 12 is an electrical equivalent circuit diagram of the monolithic LC filter shown in FIG. 11.

LC-resonator capacitor conductor 11 and 12 are provided at the areas on the left and right sides (in FIG. 10) of the insulating sheet 4, respectively, so as to be substantially symmetrical with respect to the central axis. A lead-out portion 11a of the LC-resonator capacitor conductor 11 is exposed to the left side of the sheet 4, and a lead-out portion 12a of the LC-resonator capacitor conductor 12 is exposed to the right side of the sheet 4.

Also, the LC-resonator capacitor conductors 11 and 12 are opposed to the ground conductor 19 with the insulating sheets 2 and 3 therebetween, thereby defining LC resonator capacitors C1 and C2, respectively. Furthermore, the LC-resonator capacitor conductors 11 and 12 are each opposed to the coupling capacitor conductor 10 with the insulating sheet 3 disposed therebetween, thereby defining a coupling capacitor C3.

Inductor via-holes 17a to 17e, and 18a to 18e, which are LC-resonator inductor conductors, are successively connected with one another in the laminating direction of the insulating sheets 2–9, thereby, respectively, defining LC-resonator inductors L1 and L2 having a length of about $\lambda/4$. The axial direction of these inductors L1 and L2 is substantially perpendicular to the surfaces of the insulating sheets 2–9, and substantially parallel to the laminating direction.

When a current flows through the inductors L1 and L2, a magnetic field circulating on the surface that is substantially perpendicular to the axial direction of the inductors L1 and L2 is produced around each of the inductors L1 and L2. Ends of the inductors L1 and L2 (via-holes 17a and 18a) are connected to the LC-resonator capacitor conductors 11 and 12, respectively. The other ends of the inductors L1 and L2 (via-holes 17e and 18e) are connected to the ground conductor 20, thereby defining a short circuit.

The inductor via-holes 17a to 17e, and 18a to 18e are formed by making holes with a desired shape using a mold or a laser into the insulating sheets 4 to 8, and by filling these holes with a conductive material such as Ag, Pd, Cu, Ni, Au, or Ag—Pd, or other suitable material, or by forming a layer of this conductive material on the inner surface of each of the holes.

The inductance values of the resonator inductors L1 and L2 formed of the inductor via-holes, that is, the inductance values of the inductors L1a, L1b, L2a, and L2b (these will be illustrated later in FIGS. 3 and 4) can be adjusted by adjusting the thicknesses of the insulating sheets 5 and 8. Specifically, by increasing the thickness of the insulating sheets, the inductance values of the inductors can be improved.

In this preferred embodiment, the insulating sheets 5 are arranged to be thicker than the insulating sheets 6 in relation to the capacitance values of the LC trap capacitors C4 and C5. However, if the static capacitances of the LC trap capacitors C4 and C5 are low, or if the dielectric constant of the insulating sheet 6 is high, it is necessary to enlarge the spacing between the LC-trap capacitor conductors 13 and 14, and the spacing between the LC-trap capacitor conductors 15 and 16. As a consequence, the insulating sheet 6 may need to be thicker than the insulating sheet 5. Here, each of the insulating sheets 5 and 8 may be a one-piece thick sheet, or alternatively, may be one formed by laminating a plurality of thin sheets such as the insulating sheet 6.

In this manner, the inductance values of the inductors L1a and L1b defining the LC resonator inductor L1 are adjusted such that the inductance value of the inductor L1a defining the inductor L1 of the input-side trap achieves a desired value. Likewise, the inductance values of the inductors L2a and L2b defining the LC resonator inductor L2 are adjusted such that the inductance value of the inductor L2a defining the inductor L2 of the output-side trap achieves a desired value.

The LC-trap capacitor conductors 13 and 14 are connected to the inductor via-holes 17c and 18c, respectively. As a consequence, the inductor L1 is configured with an intermediate tap that is defined by the LC-trap capacitor conductor 13, between the portion L1a defined by the via-holes 17a and 17b, and the portion L1b defined by the via-holes 17c to 17e. Likewise, the inductor L2 is configured with an intermediate tap that is defined by the LC-trap capacitor conductor 14, between the portion L2a defined by the via-holes 18a and 18b, and the portion L2b defined by the via-holes 18c to 18e.

The LC-trap capacitor conductor 13 and 14 are opposed to the LC-trap capacitor conductors 15 and 16, respectively, with the insulating sheet 6 therebetween, thereby defining an LC trap capacitors C4 and C5, respectively. A lead-out portion 15a of the LC-trap capacitor conductor 15 is exposed at the left side (in FIG. 1) of the sheet 7, and a lead-out portion 16a of the LC-trap capacitor conductor 16 is exposed at the right side (in FIG. 1) of the sheet 7.

The lead-out portions of the ground conductor 19 and 20 are exposed at both the front side and rear side (in FIG. 1) of the insulating sheets 2 and 9, respectively. Between the ground patterns 19 and 20, the LC-resonator capacitor conductors 11 and 12, and inductor via-holes 17a to 17e, and 18a to 18e are provided.

The insulating sheets 2 to 9 are laminated, and after protective insulating sheets are placed on the top and the bottom thereof, they are integrally baked. A laminate 21 shown in FIGS. 2 and 3 is thus produced.

Figure 2:
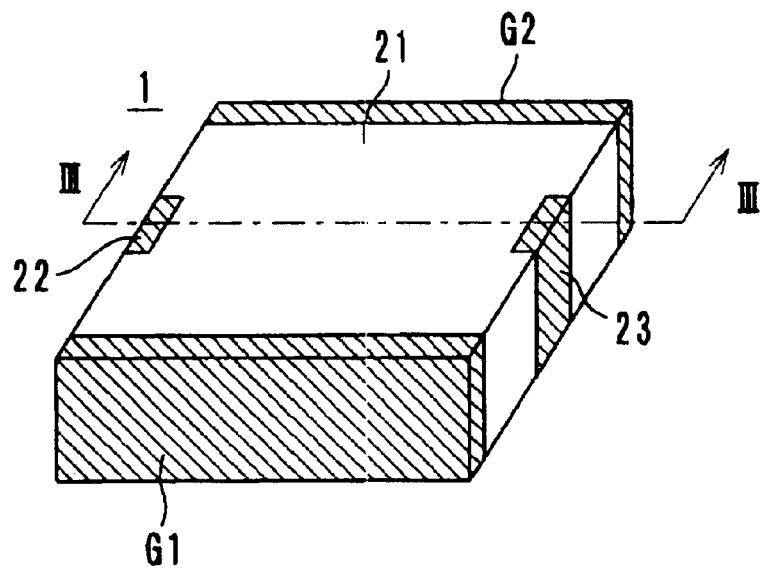
FIG. 2 is a perspective view illustrating the appearance of the monolithic LC filter shown in FIG. 1.
Figure 3:
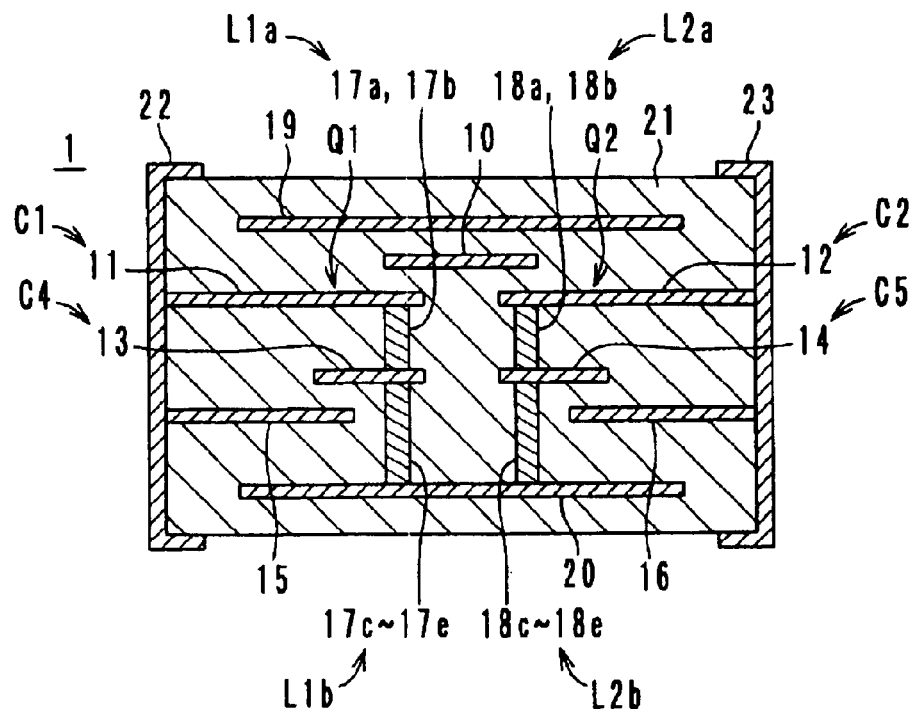
FIG. 3 is a sectional view of the monolithic LC filter taken along the line III—III in FIG. 2.

An input terminal 22 and an output terminal 23 are provided on the surface of the laminate 21, and more specifically, on the left and right end surfaces thereof (in FIGS. 2 and 3). Ground terminals G1 and G2 are provided on the front side and the rear side (in FIG. 2) of the laminate 21, respectively. A lead-out portion 11a of the resonator capacitor conductor 11, and a lead-out portion 15a of the LC-trap capacitor conductor 15 are connected to the input terminal 22. A lead-out portion 12a of the resonator capacitor conductor 12, and a lead-out portion 16a of the LC-trap capacitor conductor 16 are connected to the output terminal 23. One end of each of the ground conductors 19 and 20 is connected to the ground terminal G1, and the other end of each of the ground conductors 19 and 20 is connected to the ground terminal G2.

Figure 4:
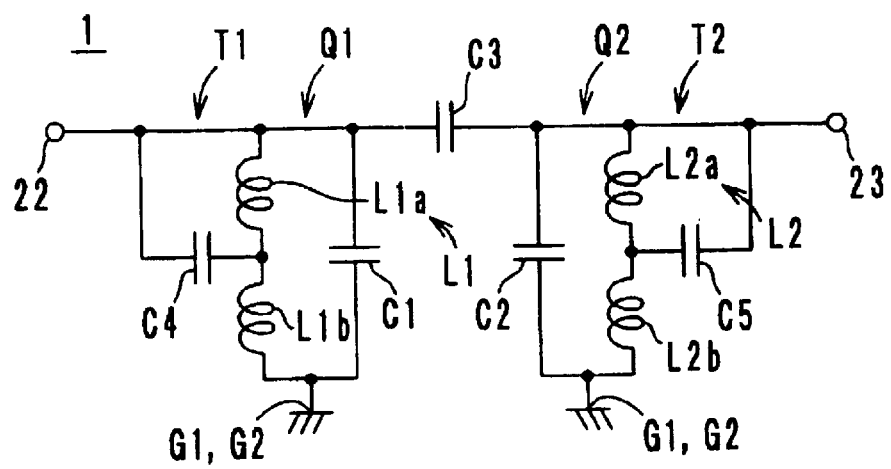
FIG. 4 is an electrical equivalent circuit diagram of the monolithic LC filter shown in FIG. 2.
Figure 5:
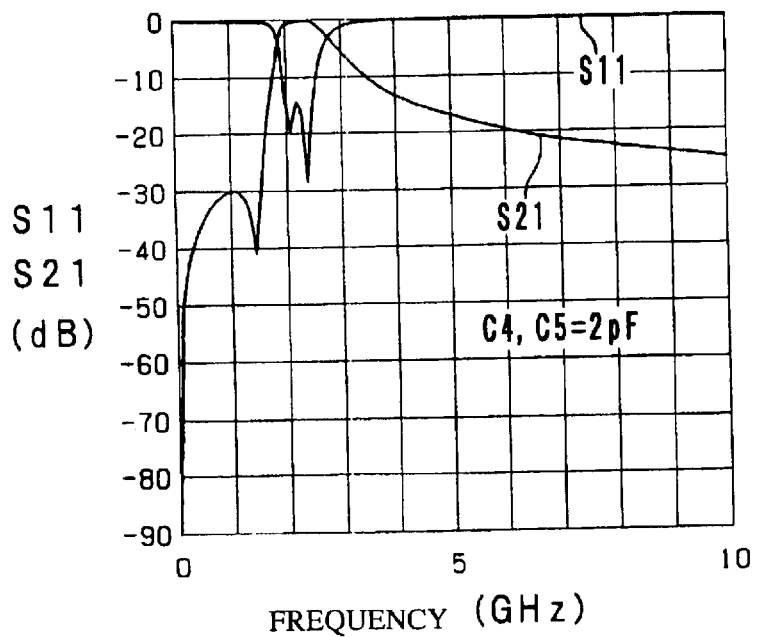
FIG. 5 is a diagram illustrating the pass characteristic S21 and the reflection characteristic S11 when LC trap capacitors C4 and C5 each having a capacitance, of about 2 pF.
Figure 6:
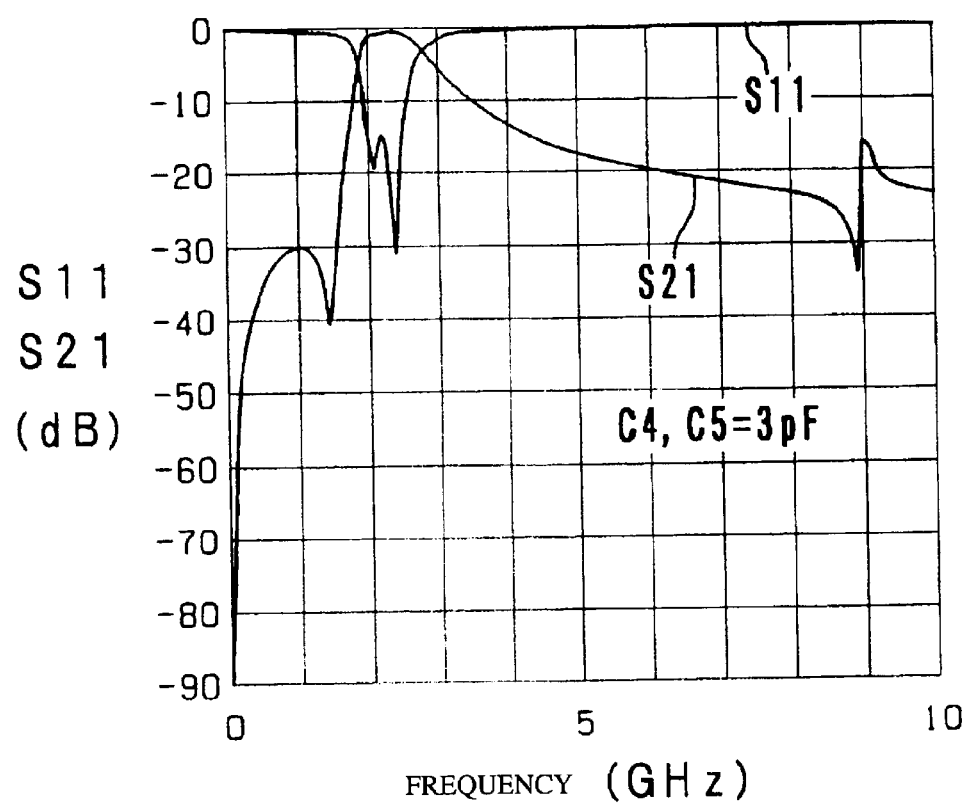
FIG. 6 is a diagram illustrating the pass characteristic S21 and the reflection characteristic S11 when LC trap capacitors C4 and C5 each having a capacitance of about 3 pF.
Figure 7:
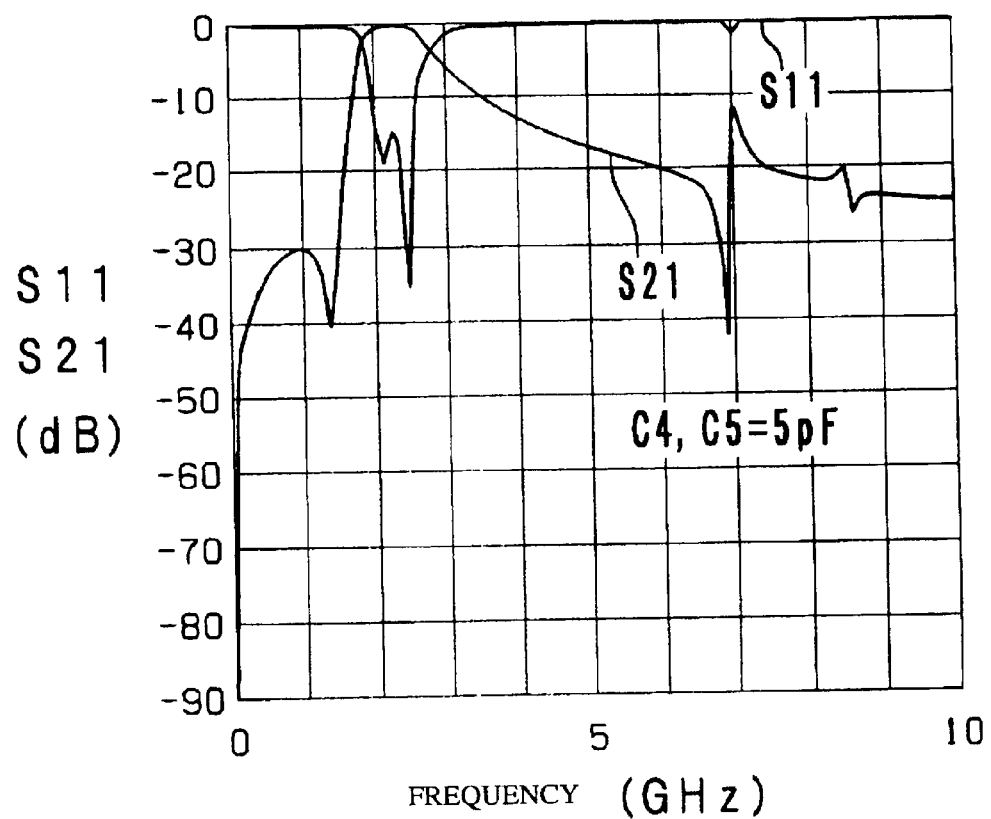
FIG. 7 is a diagram illustrating the pass characteristic S21 and the reflection characteristic S11 when LC trap capacitors C4 and C5 each having a capacitance of about 5 pF.
Figure 8:
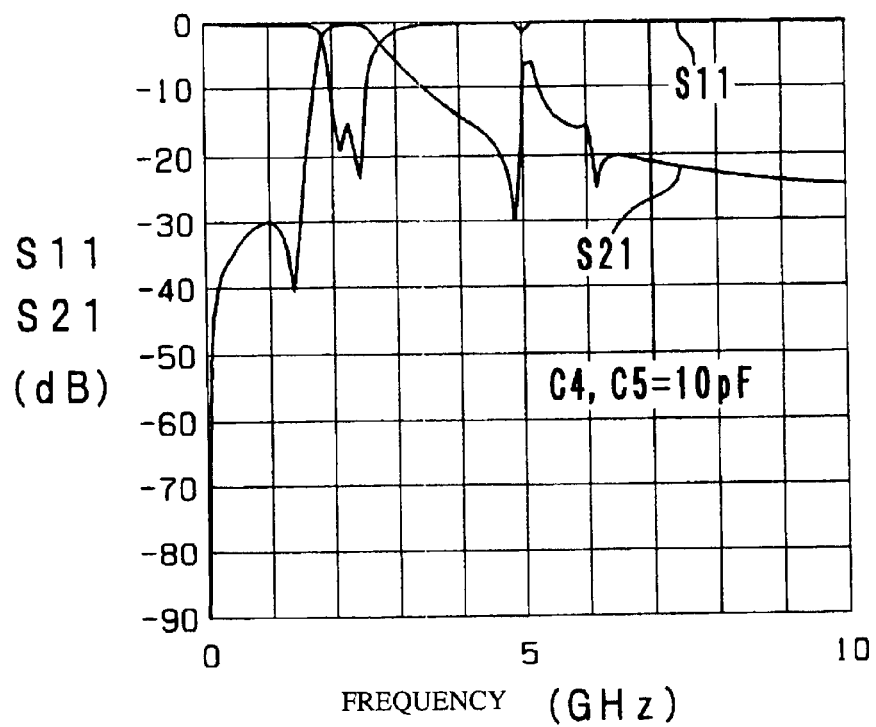
FIG. 8 is a diagram illustrating the pass characteristic S21 and the reflection characteristic S11 when LC trap capacitors C4 and C5 each having a capacitance of about 10 pF.

FIG. 4 is an electrical equivalent circuit diagram of the monolithic LC filter 1 thus obtained. Here, the LC resonator inductor L1 and the LC resonator capacitor C1 define a parallel resonant circuit, thereby providing a first LC resonator Q1. The LC resonator inductor L2 and the LC resonator capacitor C2 define a parallel resonant circuit, thereby providing a second LC resonator Q2. The LC resonators Q1 and Q2 are electrically interconnected through the coupling capacitor C3, thereby defining a two-stage band-pass filter. Herein, a portion L1a of the LC resonator inductor L1 and the LC trap capacitor C4 define an input-side LC trap circuit T1. Likewise, a portion L2a of the LC resonator inductor L2 and the LC trap capacitor C5 define an output-side LC trap circuit T2.

The input-side LC trap circuit T1 and output-side LC trap circuit T2 each define an LC parallel resonant circuit, and are each arranged in parallel with respect to a signal line connecting the input terminal 22 and the output terminal 23. Also, the first LC resonator Q1 and the second LC resonator Q2 are each arranged between the signal line connecting the input terminal 22 and the output terminal 23, and the grounds G1 and G2.

In the monolithic LC filter 1 with the above-described configuration, the portion L1a of the LC resonator inductor L1 in the first LC resonator Q1 also functions as an inductor for the LC trap circuit T1, and likewise, the portion L2a of the LC resonator inductor L2 in the second LC resonator Q2 also functions as an inductor for the LC trap circuit T2. This eliminates the necessity to separately provide an LC-trap inductor conductor. As a result, a monolithic LC filter having a reduced size and height is achieved.

The trap frequencies of the LC trap circuits T1 and T2 are determined by the inductance value of the inductor L1a and the capacitance value of the capacitor C4, and by the inductance value of the inductor L2a and the capacitance value of the capacitor C5, respectively.

For example, when $L1a = L2a = 0.1$ nH, $L1b = L2b = 0.7$ nH, $C1 = C2 = 4$ pF, $C3 = 3.2$ pF, and Q=85 for each of the inductors L1a, L1b, L2a, and L2b, the pass characteristic S21 and the reflection characteristic S11 where the capacitance values of the LC trap capacitors C4 and C5 are set to approximately 2 pF, 3 pF, 5 pF, and 10 pF, are illustrated in FIGS. 5 to 8, respectively.

As seen in FIGS. 5 to 8, by varying the capacitance value of the LC trap capacitors C4 and C5, the positions of the attenuation poles are moved. That is, attenuations at desired frequencies is secured, thereby achieving a monolithic LC filter 1 having desired characteristics.

The LC filters include a band-pass filter, a low-pass filter, a high-pass filter, and a band elimination filter. In addition, the LC filters include filters that are defined by incorporating a plurality of filters into one laminate, such as a multiplexer including a duplexer and a triplexer, which is defined by combining band-pass filters.

Figure 9:
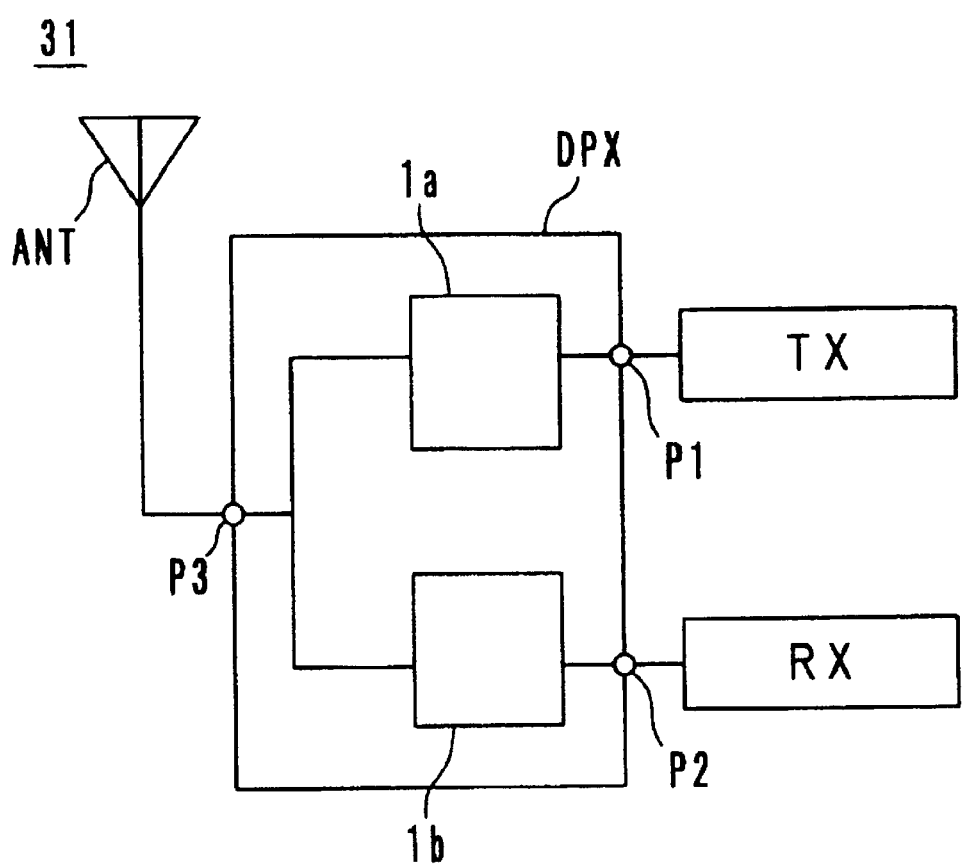
FIG. 9 is an electrical circuit block diagram illustrating an RF (radio frequency) portion in another preferred embodiment of a radio communication device according to the present invention.

Examples of the use of the LC filters are a duplexer DPX that uses two of the above-described monolithic LC filters 1 shown in FIG. 9, and a radio communication device 31 including the same. The duplexer DPX is formed by electrically connecting the monolithic LC filters 1 (1a and 1b), and includes three ports P1, P2, and P3. The port 1 of the duplexer DPX is provided at one end of the monolithic LC filter 1a, and is connected to a transmission section TX. The port 2 of the duplexer DPX is provided at one end of the monolithic LC filter 1b, and is connected to a reception section RX. The port 3 of the duplexer DPX is provided at the other end of each of the monolithic LC filter 1a and the monolithic LC filter 1b, and is connected to an antenna ANT. With this arrangement, the monolithic LC filter 1 is used as a duplexer. This makes it possible to achieve a duplexer having a reduced size and height. In the same manner, the monolithic LC filter 1 can be used as a multiplexer such as a triplexer adaptable to three frequencies.

The LC filter circuit, the monolithic LC composite component, the multiplexer, and the radio communication device according to preferred embodiments of the present invention are not limited to the above-described preferred embodiments, but may be variously modified within the scope of the invention.

The resonator inductor conductor defining the LC resonator does not need to be defined by inductor via-holes provided in the insulating sheets. Alternatively, the resonator inductor conductor may be a volute-shaped conductor pattern or a spiral-shaped conductor pattern provided on the surface of an insulating sheet.

The monolithic LC composite component according to the above-described preferred embodiments of the present invention is not restricted to the monolithic LC filter, but may be one to which the structure of the LC filter circuit or the monolithic LC composite component according to the present invention is provided as a portion of a high-frequency composite component such as an RF diode switch, a transmission/reception device, or an RF module.

The monolithic LC filter according the above-described preferred embodiments of the present invention preferably is produced using the "sheet lamination method" in which insulating sheets on each of which conductor patterns and/or via-holes are formed, are laminated, and thereafter they are integrally baked. However, the production method for the monolithic LC filter is not necessarily limited to the above-described method. The insulating sheets may be baked in advance. Alternatively, insulating sheets made of resin or other suitable material may be used instead of the above-described ceramic insulating layers.

Alternatively, the monolithic LC filter may be produced by the following method. After an insulating layer has been formed of a pasty insulative material by a method such as printing, a pasty conductive material is applied to the surface of the insulating layer, and thereby conductor patterns and/or via-holes are formed. Next, by overcoating them with the pasty insulating material, an insulating layer is produced. Alternatively, in a similar manner, the monolithic LC filter may be produced by the "printing lamination method" in which the insulating material and the conductive material are applied one after another in the above-described order.

As is evident from the foregoing, according to preferred embodiments the present invention, since a portion of the LC resonator coil is arranged to also function as an LC trap coil, it is unnecessary to separately provide an LC-trap coil conductor. This makes it possible to achieve an LC filter, a multiplexer, and a radio communication device having a greatly reduced size and height.

While the present invention has been described with reference to what are at present considered to be the preferred embodiments, it is to be understood that various changes and modification may be made thereto without departing from the invention in its broader aspects and therefore, it is intended that the appended claims cover all such changes and modifications that fall within the true spirit and scope of the invention.

What is claimed is:

1. An LC filter circuit, comprising:
   an input terminal and an output terminal;
   first and second LC resonators electrically connected between said input terminal and said output terminal;
   an input-side LC trap circuit electrically connected between said input terminal and said first LC resonator; and
   an output-side LC trap circuit electrically connected between said output terminal and said second LC resonator; wherein
   a portion of an inductor defining said first LC resonator also defines an inductor defining said input-side LC trap circuit; and
   a portion of an inductor defining said second LC resonator also defines an inductor defining said output-side LC trap circuit.

2. The LC filter circuit according to claim 1, wherein said input-side LC trap circuit and said output-side LC trap circuit are each defined by an LC parallel resonant circuit, and wherein said input-side LC trap circuit and said output-side LC trap circuit are each arranged in parallel with a signal line connecting said input terminal and said output terminal.

3. The LC filter circuit according to claim 2, wherein said first LC resonator and said second LC resonator are each defined by an LC parallel resonant circuit, and wherein said first LC resonator and said second LC resonator are arranged between said signal line and respective grounds.

4. The LC filter circuit according to claim 1, further comprising a coupling capacitor, wherein said first LC resonator and said second LC resonator are interconnected through said coupling capacitor.

5. A multiplexer circuit comprising an LC filter circuit according to claim 1.

6. A monolithic LC composite component, comprising:
   a laminate including a plurality of insulating layers that are laminated together;
   an input terminal and an output terminal provided on the surface of said laminate;
   first and second LC resonators provided in said laminate, and each of which is defined by an LC-resonator inductor conductor and an LC-resonator capacitor conductor;
   an input-side LC trap including an LC-tap capacitor conductor electrically connected between said input terminal and said first LC resonator, and a portion of said LC-resonator inductor conductor defining said first LC resonator; and
   an output-side LC trap including an LC-trap capacitor conductor electrically connected between said output terminal and said second LC resonator, and a portion of said LC-resonator inductor conductor defining said second LC resonator.

7. The monolithic LC composite component according to claim 6, wherein said LC-resonator inductor conductor is defined by via-holes successively connected with one another in the lamination direction of said insulating layers.

8. The monolithic LC composite component according to claim 6, wherein the LC-resonator inductors have a length of about $\lambda/4$.

9. The monolithic LC composite component according to claim 6, the LC-resonator capacitor conductors are provided at the areas on left and right sides of respective ones of the plurality of insulating sheets, so as to be substantially symmetrical with respect to a central axis.

10. The monolithic LC composite component according to claim 6, wherein said LC-resonator capacitor conductor in said first LC resonator, and said LC-resonator capacitor conductor in said second LC resonator are disposed on the same insulating layer.

11. The monolithic LC composite component according to claim 6, wherein ground terminals are provided on front and rear sides of the laminate.

12. The monolithic LC composite component according to claim 6, wherein a lead-out portion of at least one of the resonator capacitor conductors, and a lead-out portion of at least one of the LC-trap capacitor conductors are connected to the input terminal.

13. The monolithic LC composite component according to claim 6, said monolithic LC composite component is a monolithic LC filter.

14. The monolithic LC composite component according to claim 6, wherein the laminate is made of one of a dielectric ceramic powder, and magnetic ceramic powder and a binder.

15. The monolithic LC composite component according to claim 6, wherein via holes are provided in said laminate and are filled with a conductive material selected from the group consisting of Ag, Pd, Cu, Ni, Au, and Ag—Pd.

16. A multiplexer comprising a monolithic LC composite component according to claim 6.

17. A radio communication device comprising a monolithic LC composite component according to claim 6.

18. A radio communication device comprising a multiplexer according to claim 16.

* * * * *